United States Patent
Syed

(10) Patent No.: US 8,248,161 B2
(45) Date of Patent: Aug. 21, 2012

(54) WIDE-BAND LOW-NOISE CMOS AMPLIFIER

(75) Inventor: Shaffiullah Syed, Coral Springs, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 1776 days.

(21) Appl. No.: 11/464,092

(22) Filed: Aug. 11, 2006

(65) Prior Publication Data

US 2008/0036537 A1  Feb. 14, 2008

(51) Int. Cl.
*H03F 3/45* (2006.01)
(52) U.S. Cl. ..................................................... 330/253
(58) Field of Classification Search ........... 330/252–261
See application file for complete search history.

(56) References Cited

U.S. PATENT DOCUMENTS

| | | | |
|---|---|---|---|
| 4,831,284 A | 5/1989 | Anderson et al. | |
| 5,541,555 A | 7/1996 | Pernici | |
| 6,980,055 B2 * | 12/2005 | Gharpurey | 330/257 |

OTHER PUBLICATIONS

PCT International Preliminary Report Application No. PCT/US2007/074703—Dated Feb. 26, 2009—8 Pages.
PCT International Search Report Application No. PCT/US2007/074703—Dated Apr. 17, 2008—8 Pages.
F. Bruccoleri et al.: Generating All 2-MOS Transistors Amplifiers Leads to New Wide-Band LNAs—Dated Jul. 2001—9 Pages.
F. Bruccoleri et al.: Wide-Band CMOS Low-Noise Amplifier Exploiting Thermal Noise Canceling—Dated Feb. 2004—8 Pages.

* cited by examiner

*Primary Examiner* — Hieu Nguyen
(74) *Attorney, Agent, or Firm* — Barbara R. Doutre

(57) ABSTRACT

A CMOS low-noise wide-band amplifier (LNA) 211 is provided. The LNA can include a Gm doubler 410, a source follower 420, and a coupling circuit (430/440) that couples a differential input to the Gm doubler with the source follower for achieving high linearity over a wide frequency range at a low supply voltage. The coupling circuit can capacitively couple (434/444) a differential input to a gate of the source follower. The gate can be biased to a supply voltage through variable resistors (436/446). A cross coupler (480) can be included in a push-pull buffer (450) for additional gain and for allowing the source follower to drive a low impedance load at low power.

15 Claims, 4 Drawing Sheets

WIDE-BAND LOW-NOISE CMOS AMPLIFIER

FIELD OF THE INVENTION

This invention relates generally to communication design, and more particularly to amplifiers.

BACKGROUND OF THE INVENTION

The hand-held radio industry is constantly challenged in the market place for high audio quality, low-cost products that provide good reception and coverage. Radios generally include a receiver having a low noise amplifier (LNA) where several signal channels are processed simultaneously. The communication signals received by the radio are generally amplified prior to demodulation for increasing the dynamic range of the signal and increasing reception quality. In general, conventional radios operate over a limited frequency range. Accordingly, narrow band LNAs focus on a narrow band frequency range used by the radio. Narrow-band LNAs can exhibit low noise figures, high gain, and good impedance matching at relatively low power. In practice, a narrow band LNA includes inductive elements that provide for low power narrowband amplification and the associated benefits by exploiting a quality factor of inductance-based matching networks.

In contrast, software definable radios are allowing radios to operate over greater frequency ranges. For example, instead of being limited to a narrowband frequency range, the radios are capable of supporting communication over broader frequency ranges. The communication signals over the wider frequency also need to be amplified in similar proportion in order to provide good reception an quality. That is, a wide-band amplifier should generally provide uniform amplification across a supported radio bandwidth. However, narrow-band LNA's which are optimized for narrowband applications are not suitable for wide-band applications. It is not generally possible to simply extend the bandwidth. For example, a narrowband LNA is not practical for wide-band applications requiring more than one decade of bandwidth such as for cable TV networks (i.e., 50-900 MHz bandwidth) due to the complexity of the wide-band matching networks. In such cases, LNA solutions exploiting the wide-band nature of transistors and resistors are typically used. Wide-band amplifiers in deep-submicron CMOS are attractive in order to enable the realization of low-cost highly integrated systems. Nevertheless, wide-band amplifiers are typically designed in silicon bipolar or GaAs technologies. A need therefore exists for providing low noise, high gain, impedance matching, characteristics of a narrowband LNA in a wide-band CMOS LNA design.

SUMMARY OF THE INVENTION

Embodiments of the invention are directed to a CMOS low-noise wide-band amplifier (LNA). The LNA can include a transconductance (Gm) doubler receiving a differential input, a source follower coupled to an output of the Gm doubler for amplifying the differential input to the Gm doubler, and a coupling circuit that couples the differential input to the Gm doubler with the source follower for achieving high linearity over a wide frequency range at a low supply voltage. The coupling circuit can capacitively couple a differential input to the gate of the source follower MOSFET transistor. The gate can be biased to supply through a resistor. A cross coupler can be included in a push-pull buffer for allowing the source follower to drive a low impedance load at higher efficiency with good linearity while providing additional gain to the overall LNA.

DETAILED DESCRIPTION OF THE DRAWINGS

Figure 1:
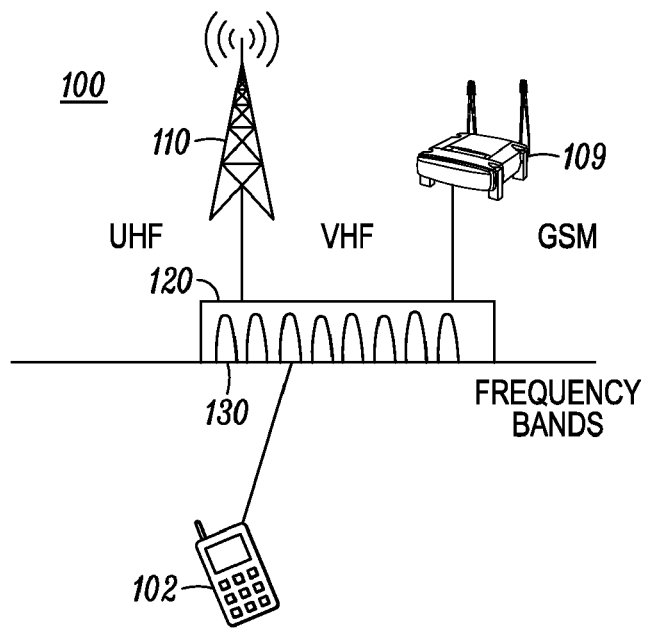
FIG. 1 is a diagram of a mobile communication system within a mobile communication environment.

While the specification concludes with claims defining the features of the embodiments of the invention that are regarded as novel, it is believed that the method, system, and other embodiments will be better understood from a consideration of the following description in conjunction with the drawing figures, in which like reference numerals are carried forward.

As required, detailed embodiments of the present method and system are disclosed herein. However, it is to be understood that the disclosed embodiments are merely exemplary, which can be embodied in various forms. Therefore, specific structural and functional details disclosed herein are not to be interpreted as limiting, but merely as a basis for the claims and as a representative basis for teaching one skilled in the art to variously employ the embodiments of the present invention in virtually any appropriately detailed structure. Further, the terms and phrases used herein are not intended to be limiting but rather to provide an understandable description of the embodiment herein.

The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "suppressing" can be defined as reducing or removing, either partially or completely. The term "processor" can be defined as any number of suitable processors, controllers, units, or the like that carry out a pre-programmed or programmed set of instructions.

Referring to FIG. 1, a mobile communication system 100 for providing mobile communication is shown. The mobile communication system 100 can include one or more subscribers, such as mobile device 102. A mobile device can be a radio, a cell phone, a personal digital assistant, a mobile communication device, a public safety radio, a portable media player, an emergency communication device, or any other suitable communication device. As another example, the mobile device 110 can be a hand-held portable, bi-directional radio transceiver such as a walkie-talkie or a two-way radio. Characteristics of the mobile device 110 may include a half-duplex mode where one user can receive or transmit at a time, or may include a full-duplex mode allowing simultaneous two-way communication. In one arrangement, more than one mobile device can operate within the mobile communication environment for providing group call or dispatch communication.

The mobile communication system 100 can provide wireless connectivity over a radio frequency (RF) communication network such as a base station 110, also known as a tower. The base station 110 may also be a base receiver, a central office, a network server, or any other suitable communication device or system for communicating with the one or more mobile devices. The mobile device 102 can communicate with one or more cellular towers 110 using a standard communication protocol such as Time Division Multiple Access (TDMA), Global Systems Mobile (GSM), or integrated Dispatch Enhanced Network (iDEN), or any other suitable modulation protocol. The base station 110 can be part of a cellular infrastructure or a radio infrastructure containing standard telecommunication equipment as is known in the art.

In another arrangement, the mobile device 102 may also communicate over a wireless local area network (WLAN). For example the mobile device 102 may communicate with a router 109, or an access point, for providing packet data communication. In a typical WLAN implementation, the physical layer can use a variety of technologies such as 802.11b or 802.11g Wireless Local Area Network (WLAN) technologies. The physical layer may use infrared, frequency hopping spread spectrum in the 2.4 GHz Band, or direct sequence spread spectrum in the 2.4 GHz Band, or any other suitable communication technology.

In particular, the base station 110, or the router 109, can support one or more frequency channels 120 to the plurality of mobile devices 102 and 104. In general, the base station 110 or the router 109 will be responsible for allocating frequency channels to the mobile device 102. Once assigned a frequency channel 130, the mobile device 102 can communicate over the network using the assigned frequency. Notably, depending on the form of communication, various frequency channels may be available. That is, the mobile device 102 may be capable of operating over multiple frequency channels. The mobile device 102 can also receive communication over the assigned frequency channel. Accordingly, a LNA is generally employed in the mobile device 102 to amplify received communication signals.

Briefly, the base station 110 provides a portion of a frequency spectrum as a frequency band such as UHF and VHF. As is known in the art, Very high frequency (VHF) is the radio frequency range from 30 MHz to 300 MHz. In contrast, Ultra high frequency (UHF) designates a frequency range between 300 MHz and 3.0 GHz. UHF frequencies' propagation characteristics are ideal for short-distance terrestrial communication such as radio communication. As one example, the UHF band can support the Family Radio Service (FRS) which is an improved two-way system or Public Safety Radio Services for providing emergency communication. As one example, within Public Safety Radio, the base station 110 can support 25 KHz bandwidth channels within a 700-800 MHz carrier frequency range. Embodiments of the invention are not however limited to the radio frequency bands and can include frequency bands associated with other TDMA systems.

Referring directly to FIG. 1, the mobile device 102 can receive communication signals from either the base station 110 or the router 109. Other telecommunication equipment can be used for providing communication and embodiments of the invention are not limited to only those components shown. As one example, the mobile device 102 may receive a UHF radio signal having a carrier frequency of 600 MHz, a GSM communication signal having a carrier frequency of 900 MHz, or a IEEE-802.11x WLAN signal having a carrier frequency of 2.4 GHz. Notably, the mobile device 102 can receive the communication signals and provide linear amplification of the communication signals across the frequency spectrum 50 MHz to 7 GHz. That is, the mobile device 102 can amplify communication signals across multiple bands that span multiple communication systems operating across various frequencies. Moreover, the mobile device 102 can provide high gain amplification with a low power supply.

Figure 2:
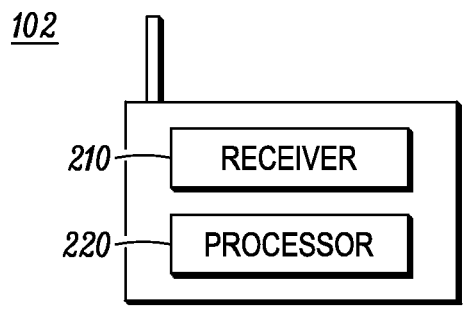
FIG. 2 is a schematic of a mobile device in accordance with the embodiments of the invention.

Referring to FIG. 2, a block diagram of the mobile device 102 is shown. The mobile device 102 can include a receiver 210 for receiving one or more communication signals, and a processor 220 for processing the communication signals. As an example, the receiver 210 can demodulate a communication signal and generate a digital base-band signal such as a compressed data signal. The processor 220 can include signal processing components to convert the compressed data into an audio signal, a video signal, an image, a message, or the like. The processor 220 may provide echo suppression, dynamic range expansion, equalization, image enhancement, and the like.

Figure 3:
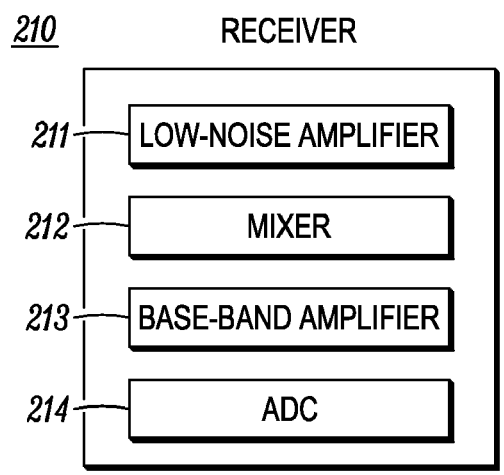
FIG. 3 is a schematic of a receiver of the mobile device of FIG. 2 in accordance with the embodiments of the invention.

Referring to FIG. 3, the receiver 210 is shown in greater detail. The receiver can include a low-noise amplifier 211, a mixer 212, a base-band amplifier 213, and an analog to digital converter. The low-noise amplifier 211 can amplify a received communication signal, and the mixer 212 can demodulate the amplified communication signal to baseband. The low-noise amplifier 211 amplifies a signal as the communication signals received at the mobile device 102 may be weak due to transmission. For example, referring back to FIG. 1, the mobile device 102 may be located far away from the base station 110. Accordingly, the signal strength and the reception quality may be low. The low-noise amplifier 211 increases the dynamic range of the signal and improves demodulation. The demodulation may be QPSK, FSK, BPSK, OFDM, or any other suitable modulation scheme. The base-band signal out of the mixer 212 can be further amplified by a base-band amplifier, and converted from an analog signal to a digital signal by the ADC 214. The digital signal out of the ADC 214 may be further processed by the processor 220 of FIG. 2.

Figure 4:
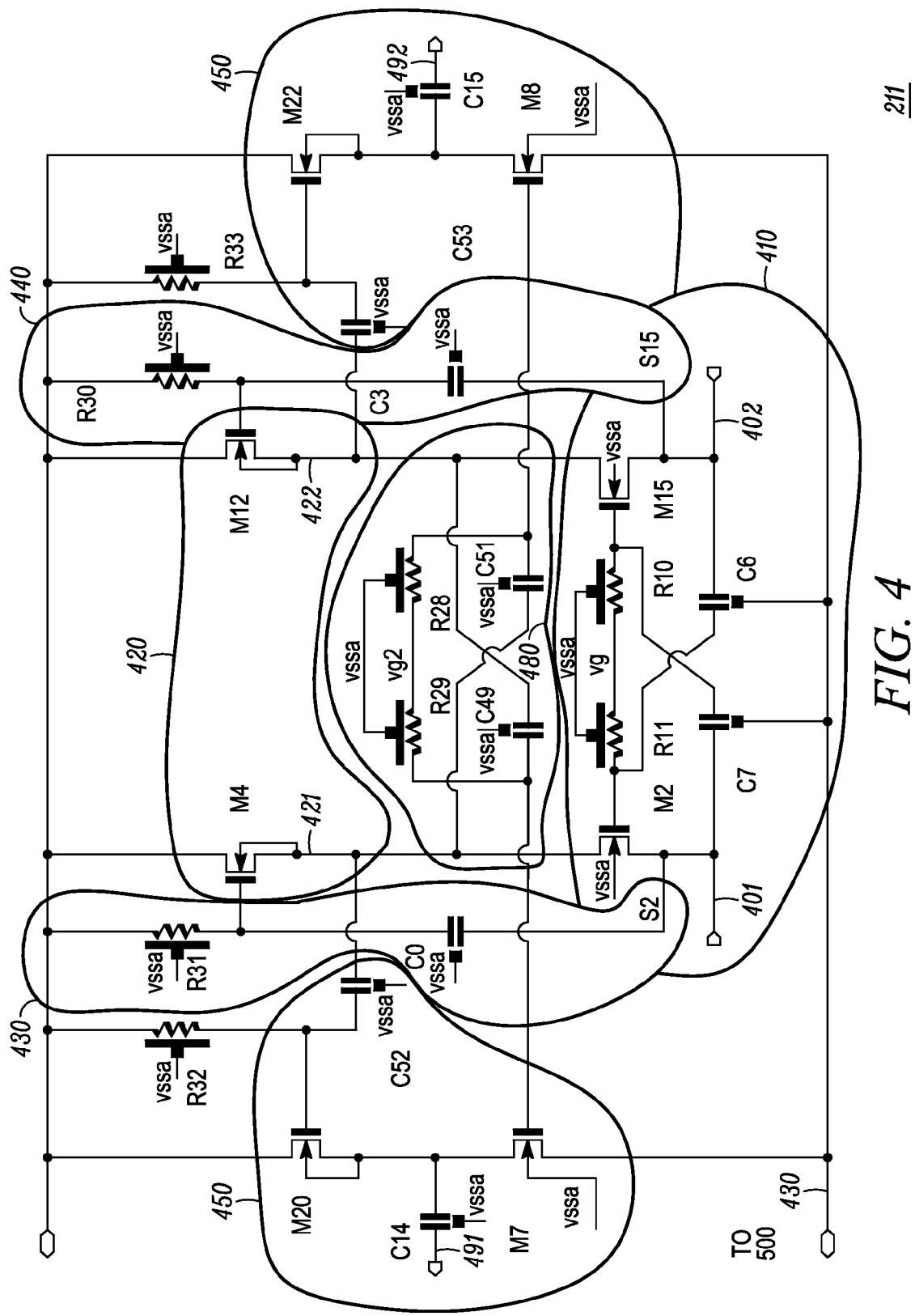
FIG. 4 is a schematic of a low noise amplifier of the receiver of FIG. 3 in accordance with the embodiments of the invention.

Referring to FIG. 4, the low-noise amplifier 211 of FIG. 3, is broadly shown. In particular, a categorization of the low-noise amplifier 211 is shown. Briefly, the categorization identifies a Gm (transconductance) doubler 410, a source follower 420, a coupling circuit 430/440, a push-pull buffer 450, a cross coupler 480.

The Gm doubler 410 provides a differential input gain stage for amplifying a communication signal. The Gm doubler 410 can enhance a transconductance (Gm) of a differential input signal applied at 401 and 402. In particular, the cross coupled capacitor comprising elements R10, R11, C7, and C6 provide a common gate topology that provides Gm doubling; that is, gain enhancement of the differential input signal. A cross coupled capacitor arrangement of the Gm doubler 410 provides a higher gain from the M2 and M15 (MOSFET) devices without increasing their size. The cross coupled capacitor arrangement of Gm doubler 410 is not a part of the source follower 420. The capacitors C7 and C6 provide the cross coupling of the differential input signal both at the source input of M2 and opposite gate input of the device M15 in effect doubling the differential input signal drive to the amplifier. Note the drain 421 of M2 is common to the source 421 of M4 and M4 device acts as the load for the M2. That is, they are the same connection. Similarly, the drain 422 of M15 is common to the source 422 of M12, where M12 is the load of M12. That is they are the same connection. The cross coupled capacitor arrangement provides almost twice the gain from M2 and M15. This input circuit topology of the cross coupled capacitor arrangement for the Gm doubler is known in the art.

The source follower 420 comprises a first M4 (MOSFET) and a second M12 (MOSFET). The MOSFETs of the LNA 211 include a gate, a drain, and a source as is known in the art. The source follower 420 provides a load for the differential output of the Gm doubler 410. The differential output corresponds to drain 421 of M2 and drain 422 of M15. The input circuit topology of the source follower 420 is known in the art.

The differential output (421 and 422) of the source follower 420 is fed to the push-pull buffer 450. For example, the source 421 of M4 corresponds to the first differential output, and the source 422 of M12 corresponds to the second differential output of the source follower 420. The differential output can be alternate current (AC) coupled via a capacitor to the push-pull buffer 450. For example output 421 can be coupled through C52 to the left side push pull buffer. The output 422 can be coupled through C53 to the right side push pull buffer. The push-pull buffer 450 can source current to an output device, while providing additional gain from the second stage based on the Gm ratio of the MOSFETs M7 to M20 and M8 to M22. For example, referring back to FIG. 3, an output device may be the mixer 212 that is connected to differential output 491 and 492 of the LNA 211. The input circuit topology of the push-pull buffer 450 arrangement is known in the art.

The cross coupler 480 couples the output of the right side of the first stage source follower output 422 to the left side of push-pull buffer 450 into M7 via C49 & R29 and the left side of the first stage source follower output 421 to the right side of the push-pull buffer 450 into M8 via C51 & R28. Notably, the cross coupled arrangement consisting of C49, C51, R29, and R28 enhances low impedance driving capability of the push-pull buffer 450 over a wide bandwidth and is a novel addition to the push-pull buffer 250 in the context of the wide-band low-noise low-power configuration of the LNA 211.

In one arrangement, the mixer 212 may be direct conversion switching mixer which has a square wave LO signal driving the transmission gate switches and hence have peak charge and discharge currents that it draws from the LNA second stage buffer. The mixer load is typically the input impedance of the PMA along with a wideband pole filter (which in this case is just a capacitor). This capacitor load of the mixer looks like a short-circuit at RF frequency, while being open at baseband frequency. The second stage of the LNA 211 (which operates at RF frequency) hence sees the on-resistance of the switch as the load due to capacitor acting as a short at RF frequency.

In order to allow the Gm doubler 410, the source follower 420, and the push-pull buffer 450, to source current to low impedance loads over a wide range of frequencies at low voltage, the coupling circuits 430 and 440, the bias circuit 460 and 470, and the cross coupler 480 are employed. Notably, the combination of the Gm doubler along with the source follower load and its coupling circuits 430 and 440 and the cross coupler 480 for the push pull buffer 450 are novel aspects of the LNA 211.

Figure 5:
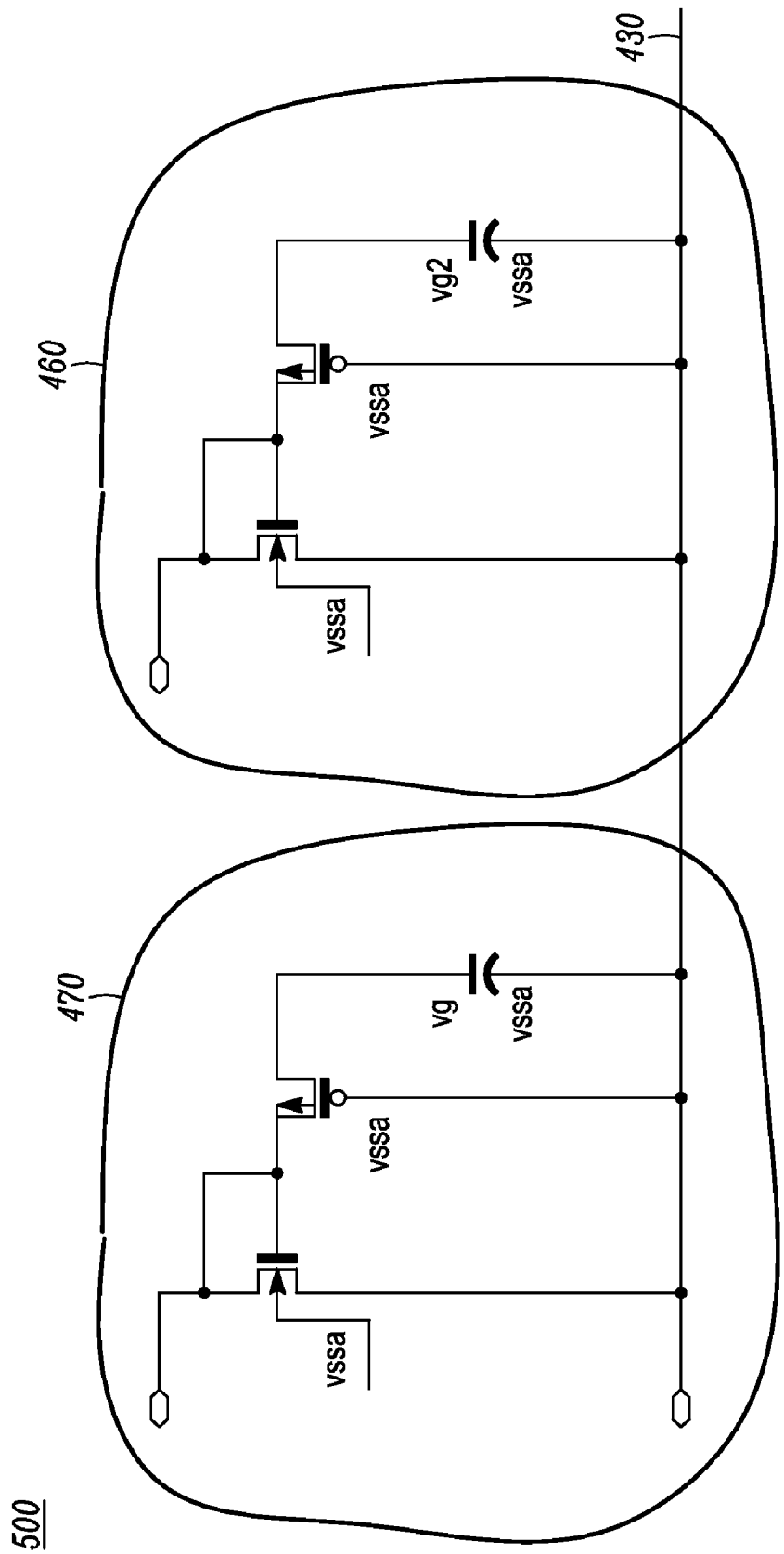
FIG. 5 is a schematic of a biasing circuit for the low noise amplifier of FIG. 4 in accordance with the embodiments of the invention.

Briefly referring to FIG. 5, a biasing circuit 500 for the LNA 211 is shown. The biasing circuit 500 can include a first current mirror 460 and a second current mirror 470. The first current mirror 460 and the second current mirror 470 can control the DC bias current 430 to the LNA 211.

Figure 6:
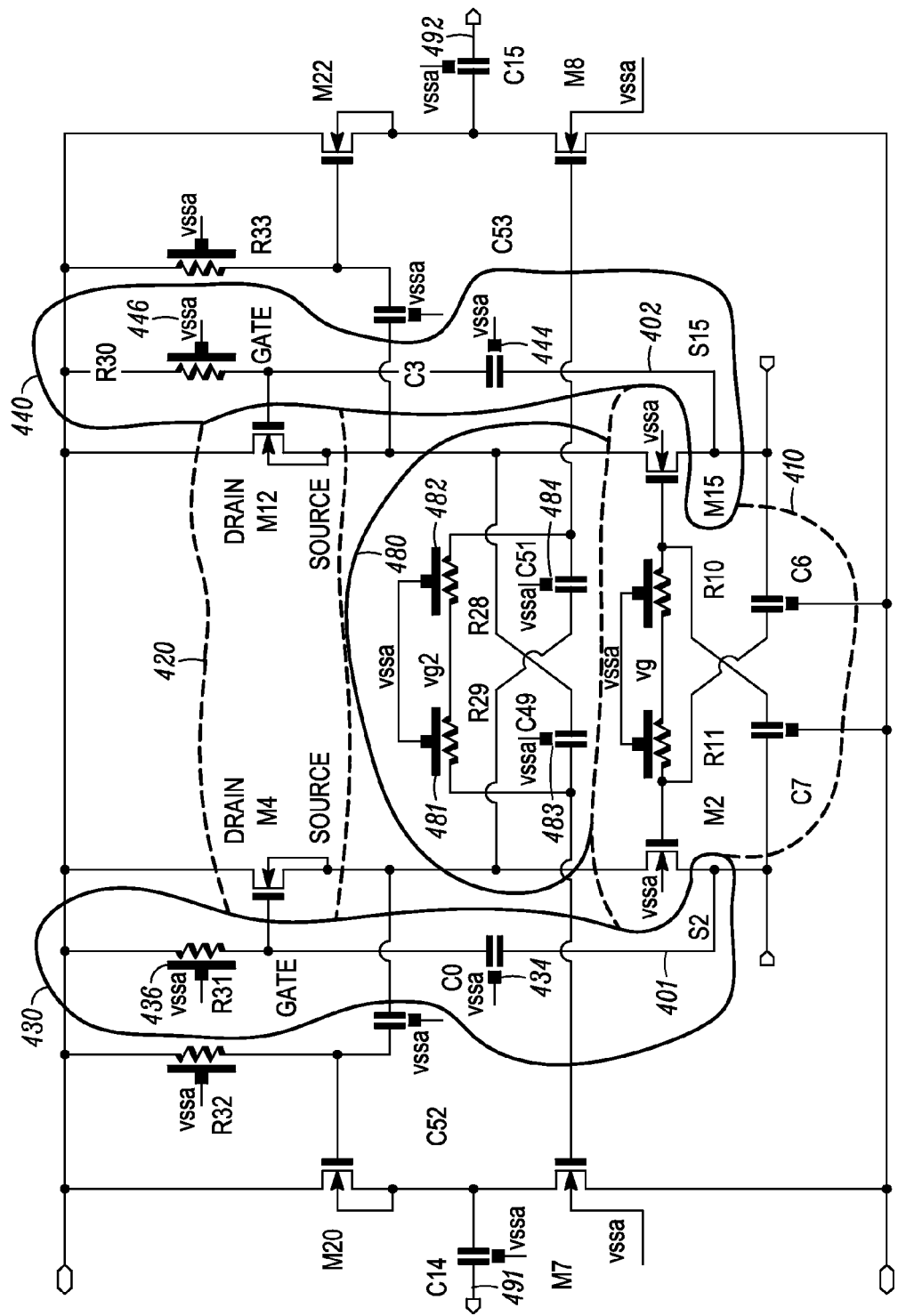
FIG. 6 is a more detailed schematic of the low noise amplifier of FIG. 4 in accordance with the embodiments of the invention.

Referring to FIG. 6, a detailed schematic of the coupling circuits 430 and 440 and the cross coupler 480 are shown in context of the LNA 211. The coupling circuits 430 and 440 allow for a low-power, wide-band, and linear amplification. Specifically, coupling circuits 430 and 440 allow the LNA 211 to provides a low noise figure over a wide frequency range. That is, the combination of the Gm doubler 410 input stage with the source follower 420 load provided by the coupling circuits 430 and 440 provide linearity enhancement without degrading noise figures in a low supply over a large bandwidth. As an example, the LNA 211 can be implemented as a single CMOS design covering a wide frequency range that satisfies noise floor, Gain, input-referred third order intercept point (IIP3) without using inductors and with only 1.2V supply The cross coupler 480 enhances low impedance drive capability of push-pull buffer 450 over a wide bandwidth. Specifically, the push-pull buffer 450 provides additional gain without sacrificing linearity. The inclusion of the cross coupler 480 within the push-pull arrangement is unique. It does not require a large device to minimize a gain loss of the source follower 420 as it has inherent gain due to 1+gm1/gm2 gain effect of the push-pull buffer 450. Moreover, an operating bandwidth is increased by isolating the output of the source follower 420 from a load at the outputs 491 and 492. For example, referring back to FIG. 3, the mixer 212 may be a low impedance load connected to the outputs 491 and 492 of the LNA 211. The cross coupler 480 consists of C51 (484), C49 (483), R29 (481), and R28 (482). The cross coupler 480 couples an output of the source follower 420 with the push-pull buffer 250. Specifically, C49 cross couples the source of M12 with M7, and C51 cross coupled the source of M4 with M8. Two bias resistors R29 and R28 are provided for biasing the LNA 211. The cross coupler 480 improves an operating efficiency of the push-pull buffer 250 with regard to changing frequencies for driving switching mixer loads. For example, referring back to FIG. 3, the mixer may need to demodulate multiple communication signals spanning a wide frequency range. The cross coupler 480 allows the LNA 211 to support amplification of communication signals over a wider range.

Referring back to the coupling circuits 430 and 440, two components are provided. A first component is an AC coupled capacitor providing a direct line from an input signal of the Gm doubler 410 to a gate of a MOSFET in the source follower 420. A second component is a resistor for biasing the gate of the MOSFET device. For example, referring to the first coupling circuit 430, the first differential input 401 is coupled through the AC capacitor C0 (434) to the gate of M4. The gate of M4 is also biased to the voltage supply via R31 (436). Similarly, second differential input 402 is coupled through the AC capacitor C3 (444) to the gate of M12. The gate of M12 is also biased to the voltage supply via R30 (446).

As an example, a communication signal captured by the receiver 212 (See FIG. 3) can be coupled as a differential input to the Gm doubler 410 of the LNA 211 at a first input 401 and a second input 402. An output 421/422 (See FIG. 4) of the Gm doubler 410 is developed across the source follower 420 which acts as load for amplifying the communication signal as previously discussed. The first Gm doubler output 421 corresponds to the first connection between M2 and M4, The second Gm doubler output 422 corresponds to the second connection between M15 and M12. Notably, the first differential input 401 is coupled to the source follower 420 through the coupling circuit 430. The second differential input 402 is coupled to the source follower 420 through the coupling circuit 440. In particular, the coupling circuits 430 and 440 combine the Gm doubler 410 with the source follower 420 for achieving high linearity over a wide frequency range and this combination is a novel aspect of the invention.

The specific configuration of the coupling circuits 430 and 440 with the cross coupler 480 allow the source follower 420 to drive low impedance loads over a wide frequency range at low voltage. For example, a load can be applied at drain 421 and 422. If the load is high impedance, the push pull buffer 450 may be from the LNA. In this case, the Gm doubler 410 along with Source follower 420 load can drive a high impedance load over a decade bandwidth without the push-pull buffer 450. In order to enhance the low impedance drive capability and improve the power gain of the LNA, the push-pull buffer 450 is included to allow the Gm doubler 410/Source follower 420 pair to drive the load over a decade bandwidth.

The forward coupling of the differential input signal to the load device provides linearity enhancement as the load varies with the input signal and acts like a non-linear load for the nonlinear input gm. The input signals 410 and 402 are both tracked together up to a certain degree and cancel the non-linearities of the input device; that is, the device coupled to inputs 401 and 402. For example, referring back to FIG. 3, the input device may be an RF modem in the receiver 210 providing a communication signal to the LNA 211.

A first order mathematical explanation is provided for the linearity enhancement from the circuit topology. The analysis is considered as a direct current (DC) analysis. For the LNA first stage the equations are given below, where $gm_1$ is the transconductance of the input device and the $gm_2$ is the transconductance of the load device (source follower)

$$Zin \approx 1/2gm_1$$

$$Zout \approx 1/gm_2$$

$$Avf \approx 1 + (2gm_1/gm_2)$$

$$Avr \approx 0$$

Where Zin stands for input impedance of the LNA, Zout is the output impedance of the first stage of the LNA and Avf stands for the forward voltage gain and Avr is reverse voltage gain.

From the forward gain equation we have $$Avf \approx 1 + (2gm_1/gm_2)$$

$$Vo/Vin \approx 1 + 2\sqrt{2\beta_1 I_{D1}/2\beta_2 I_{D2}}$$

But we have, $I_{D1}=I_{D2}$ as it's the current in the same net (the two devices are stacked together)
So we get $$Vo/Vin \approx 1 + 2\sqrt{\beta_1/\beta_2},$$

Which is independent of any $I_D$ term that produces higher order non-linearity terms as the input signal is increased, from the equation for gain and output voltage and hence gives better linearity overall. The ratio of the gain impedance and the load device makes the low noise amp fain independent of process variation. When same device types are used for both the load (421 and 422) and input (401 and 402), any process gradient could affect both the devices similarly. For example, the input device coupled to 401 and 402 would be affected as well as an output device coupled to 491 and 492. Since the gain is the ratio of the two transconductances (gm), M2 and M15 both track the variations and move in the same direction. Hence the gain is less sensitive to process variation thereby providing noise reduction in addition to gain doubling.

The LNA 211 uses a MOSFET common gate input topology with cross coupled capacitors for noise canceling and 'gm' enhancement as previously discussed. Notably, the input signals 401 and 402 are also coupled into the gates for M4 and M12 of the source follower 420 with an AC coupled capacitor C0 (434) and C3 (444), respectively, The AC coupling of the input signal to the source follower 420 is a secondary path to the output of the Gm doubler 410 and aids in linearity enhancement and lower output impedance. The gates for M4 and M12 of the source follower 420 are also biased at supply through the resistors R31 and R30, respectively. The power consumption of the circuit is set by input impedance and IIP3 requirements of the input device and output loading device. The gain of the LNA 211 is set by the ratio of the Gm of the input device and the output load device, making the gain independent of any process variation.

The low-noise amplifier (LNA) 211 can be implemented in as a wide-band CMOS design having an operating frequency between 50 MHz to 7 GHz. A topology of the LNA includes the coupling circuit 430 as a novel element between the Gm doubler 410 and the source follower 420 to achieve higher than a +5 dBm input-referred third order intercept point (IIP3) with a voltage gain of 14 dB in 200 ohms differential load. A simulation of the LNA 211 can provide a noise floor (NF) of between 2 and 3 dB or better. The LNA 211 can operate with a 1.2 volt (V) supply drawing 18 mA current for +7 dBm IIP3. A voltage gain and NF of the LNA 211 are relatively independent of a bias current. Moreover, the IIP3 can be scaled between 4 dBm and 7 dbM by adjusting the bias current. The bias current can be controlled by adjusting changing the reference current of the current mirror. The input impedance of the LNA 211 at the differential input 401 and 402 is approximately ~50-60 ohms differential at 10 mA bias current. The input impedance is inversely proportional to the Gm (transconductance) of the input device which in turn depends on the bias current. For example, referring back to FIG. 3, an RF modem in the receiver 210 providing the communication signal to the inputs 401 and 402 may have a transconductance that affects the input impedance of the differential inputs 401 and 402.

Experimental simulation results can confirm wide-band and linear operation of the LNA 211. Briefly, the simulation uses a 50 ohm low-impedance differential input, and provides an LNA gain of 14 dB with a 3 dB bandwidth of (50 MHz-7 GHz) in 200 ohm load with 2.5 dB NF and +7 dBm IIP3. The noise figure is higher at lower frequencies and tends to flatten after 400 MHz at 2 dB level due to the ac coupling capacitor sizing used, at the input, output and inter stages to cover larger bandwidths. The design was done completely in 1.2V using CMOS090 process with 18 mA current drain.

Where applicable, the present embodiments of the invention can be realized in hardware, software or a combination of hardware and software. Any kind of computer system or other apparatus adapted for carrying out the methods described herein are suitable. A typical combination of hardware and software can be a mobile communications device with a computer program that, when being loaded and executed, can control the mobile communications device such that it carries out the methods described herein. Portions of the present method and system may also be embedded in a computer program product, which comprises all the features enabling the implementation of the methods described herein and which when loaded in a computer system, is able to carry out these methods.

While the preferred embodiments of the invention have been illustrated and described, it will be clear that the embodiments of the invention are not limited. Numerous modifications, changes, variations, substitutions and equivalents will occur to those skilled in the art without departing from the spirit and scope of the present embodiments of the invention as defined by the appended claims.

What is claimed is:

1. A CMOS low-noise wide-band amplifier, comprising:
a transconductance (Gm) doubler receiving a differential input;
a source follower coupled to an output of the Gm doubler for amplifying the differential input to the Gm doubler; and
a coupling circuit that couples the differential input to the Gm doubler with the source follower for achieving high linearity over a wide frequency range at a low supply voltage, wherein the Gm doubler is a common gate MOSFET differential amplifier with a cross-coupled capacitor pair for increasing noise cancelling performance and decreasing input impedance mismatch.

2. The CMOS low-noise wide-band amplifier of claim 1, wherein a gain of the low noise differential amplifier is set by a ratio of a transconductance of the differential input to the Gm doubler and a transconductance of a load applied to an output of the source follower.

3. The CMOS low-noise wide-band amplifier of claim 1, wherein a power consumption of the CMOS low noise amplifier is set by an input impedance to the Gm doubler and an output impedance of the source follower.

4. The CMOS low-noise wide-band amplifier of claim 3, wherein a linear range of the CMOS low noise amplifier is within a 3 dB bandwidth that extends approximately from 50 MHz to 7 GHz.

5. A CMOS low-noise wide-band amplifier, comprising:
a transconductance (Gm) doubler receiving a differential input;
a source follower coupled to an output of the Gm doubler for amplifying the differential input to the Gm doubler;
a coupling circuit that couples the differential input to the Gm doubler with the source follower for achieving high linearity over a wide frequency range at a low supply voltage; and
a push-pull buffer coupled to an output of the source follower,
wherein the push-pull buffer has an additional gain of 1+gm1/gm2, while driving low impedance loads due to a combined topology of the Gm doubler and source follower with the coupling circuit;
a cross coupler cooperatively coupling an output of the source follower with an input of the push-pull buffer to drive low impedance loads over a wide bandwidth.

6. A CMOS low-noise wide-band amplifier, comprising:
a transconductance (Gm) doubler receiving a differential input;
a source follower coupled to an output of the Gm doubler for amplifying the differential input to the Gm doubler; and
a coupling circuit that couples the differential input to the Gm doubler with the source follower for achieving high linearity over a wide frequency range at a low supply voltage, wherein the coupling circuit further comprises:
a first alternate current (AC) capacitor coupling a first differential input to the Gm doubler with a first gate of the source follower; and
a second alternate current (AC) capacitor coupling a second differential input to the Gm doubler with a second gate of the source follower,
wherein the first differential input is forward coupled into the first gate of the source follower through the first AC coupled capacitor and the second differential input is forward coupled into the second gate of the source follower through the second AC coupled capacitor for extending an input-referred third order intercept point (IIP3) to provide the high linearity, wherein the first AC coupled capacitor and the second AC coupled capacitor are approximately the same capacitance for reducing impedance mismatch.

7. The CMOS low-noise wide-band amplifier of claim 6, wherein a supply voltage of the CMOS low noise amplifier is under 1.2 volts.

8. The CMOS low-noise wide-band amplifier of claim 7, wherein a gain of the CMOS low noise amplifier is approximately 14 dB.

9. The CMOS low-noise wide-band amplifier of claim 7, wherein the source follower drives a low impedance load of less than 200 Ohms.

10. A CMOS low-noise wide-band amplifier, comprising:
a transconductance (Gm) doubler receiving a differential input;
a source follower coupled to an output of the Gm doubler for amplifying the differential input to the Gm doubler; and
a coupling circuit that couples the differential input to the Gm doubler with the source follower for achieving high linearity over a wide frequency range at a low supply voltage, wherein the coupling circuit further comprises:
a first alternate current (AC) capacitor coupling a first differential input to the Gm doubler with a first gate of the source follower; and
a second alternate current (AC) capacitor coupling a second differential input to the Gm doubler with a second gate of the source follower,
wherein the first differential input is forward coupled into the first gate of the source follower through the first AC coupled capacitor and the second differential input is forward coupled into the second gate of the source follower through the second AC coupled capacitor for extending an input-referred third order intercept point (IIP3) to provide the high linearity, wherein the coupling circuit further comprises:
a first resistor for biasing the first gate at the supply voltage, wherein the first resistor couples the supply voltage to the first gate of the source follower; and
a second resistor for biasing the second gate at the supply voltage, wherein the second resistor couples the supply voltage to the second gate of the source follower.

11. A wide-band low-noise receiver, comprising:
a CMOS low noise amplifier having
a transconductance (Gm) doubler receiving a differential input;
a source follower coupled to an output of the Gm doubler for amplifying a differential input to the Gm doubler; and
a coupling circuit that couples the differential input to the Gm doubler with the source follower for achieving high linearity over a wide frequency range at a low supply voltage, and
a mixer having an input coupled to an output of the CMOS low noise amplifier for modulating a signal down to a baseband signal, wherein the coupling circuit further comprises:
a first alternate current (AC) capacitor coupling a first differential input to the Gm doubler with a first common gate of the source follower; and
a second alternate current (AC) capacitor coupling a second differential input to the Gm doubler with a second common gate of the source follower,
wherein the first differential input is forward coupled into the first common gate of the source follower through the first AC coupled capacitor and the second differential input is forward coupled into the second common gate of the source follower through the second AC coupled capacitor for extending an input-referred third order intercept point (IIP3) to provide the high linearity.

12. A wide-band low-noise receiver, comprising:
a CMOS low noise amplifier having
   a transconductance (Gm) doubler receiving a differential input;
   a source follower coupled to an output of the Gm doubler for amplifying a differential input to the Gm doubler; and
   a coupling circuit that couples the differential input to the Gm doubler with the source follower for achieving high linearity over a wide frequency range at a low supply voltage, and
a mixer having an input coupled to an output of the CMOS low noise amplifier for modulating a signal down to a baseband signal, wherein the coupling circuit further comprises:
   a first resistor for biasing the first common gate at a supply voltage, wherein the first resistor couples the supply voltage to the first common gate of the source follower; and
   a second resistor for biasing the second common gate at the supply voltage, wherein the second resistor couples the supply voltage to the second common gate of the source follower.

13. The wide-band low-noise receiver of claim 12, wherein the CMOS low noise amplifier is implemented in a software definable radio for providing a wide-band linear region of operation having a low noise floor.

14. A wide-band low-noise differential CMOS amplifier, comprising:
   a transconductance (Gm) doubler providing a differential input gain stage;
   a source follower coupled to an output of the Gm doubler for amplifying a differential input to the Gm doubler,
   a coupling circuit that couples the differential input to the Gm doubler with the source follower for achieving high linearity over a wide frequency range at a low supply voltage,
   wherein the coupling of the differential input signal to an input of the load device provides a secondary path to the output of the low noise differential CMOS amplifier that extends an operating range linearity and lowers an output impedance,
   wherein the load device is a source follower having a differential input that is common to the Gm doubler, and the source follower is biased at a supply voltage through a matched pair of resistors applied to a common gate of the source follower.

15. The CMOS low-noise wide-band amplifier of claim 14, further comprising:
   a push-pull buffer coupled to an output of the source follower through a cross coupler cooperatively coupling an output of the source follower with an input of the push-pull buffer to drive low impedance loads over a wide bandwidth,
   wherein the push-pull buffer has an additional gain of $1+gm1/gm2$ for driving low impedance loads due to a combined topology of the Gm doubler and source follower.

* * * * *

UNITED STATES PATENT AND TRADEMARK OFFICE
CERTIFICATE OF CORRECTION

PATENT NO. : 8,248,161 B2
APPLICATION NO. : 11/464092
DATED : August 21, 2012
INVENTOR(S) : Syed Page 1 of 1

It is certified that error appears in the above-identified patent and that said Letters Patent is hereby corrected as shown below:

On the Title Page, in Item (75), under "Inventor", in Column 1, Line 1, delete "Shaffiullah Syed" and insert -- Shafiullah Syed --, therefor.

In Column 1, Line 34, delete "reception an" and insert -- reception --, therefor.

In Column 6, Line 11, delete "supply" and insert -- supply. --, therefor.

Signed and Sealed this
Fifth Day of February, 2013

Teresa Stanek Rea
*Acting Director of the United States Patent and Trademark Office*